United States Patent [19]

Besson

[11] 4,063,182
[45] Dec. 13, 1977

[54] SAMPLE-AND-HOLD CIRCUIT FOR ANALOG VOLTAGES

[75] Inventor: Yves Besson, Paris, France

[73] Assignee: Thomson-CSF, Paris, France

[21] Appl. No.: 642,322

[22] Filed: Dec. 19, 1975

[30] Foreign Application Priority Data

Dec. 27, 1974 France .................................. 74.43144

[51] Int. Cl.² ........................................... H03K 17/26
[52] U.S. Cl. ..................................... 328/151; 307/353; 307/358; 331/10; 331/14; 331/17; 343/5 R
[58] Field of Search ............ 307/235 B, 235 C, 235 J, 307/235 K; 328/150, 151, 155; 343/5 R; 331/14, 10, 17

[56] References Cited

U.S. PATENT DOCUMENTS 3,636,458  1/1972  Sugiyama et al. .................. 328/151
3,686,577  8/1972  Fruhauf ........................... 307/235 C Primary Examiner—John Zazworsky
Assistant Examiner—Marcus S. Rasco
Attorney, Agent, or Firm—Karl F. Ross

[57] ABSTRACT

A sample-and-hold circuit has an input terminal connected to a source of analog voltages to be stored, this terminal being connected during a sampling phase via a first switch to an output terminal and to an input of a first amplifier working into a storage capacitor by way of a second switch also closed during that phase. The capacitor is tied to one of two differential inputs of a second amplifier, the other differential input being connected to the output of the first amplifier upon closure of a third switch during a holding phase in which the first and second switches are open. A fourth switch, also closed during the holding phase, establishes a feedback path from the output of the second amplifier to the input of the first amplifier whereby the two differential inputs are energized with substantially equal voltages maintaining a certain error voltage which is smoothed by a low-pass filter or integrator in the feedback path and which appears on the output terminal with a magnitude equal to that of the source voltage. The circuit may be used in a pulse radar to lock the freqency of a local oscillator onto a variable carrier frequency.

6 Claims, 7 Drawing Figures

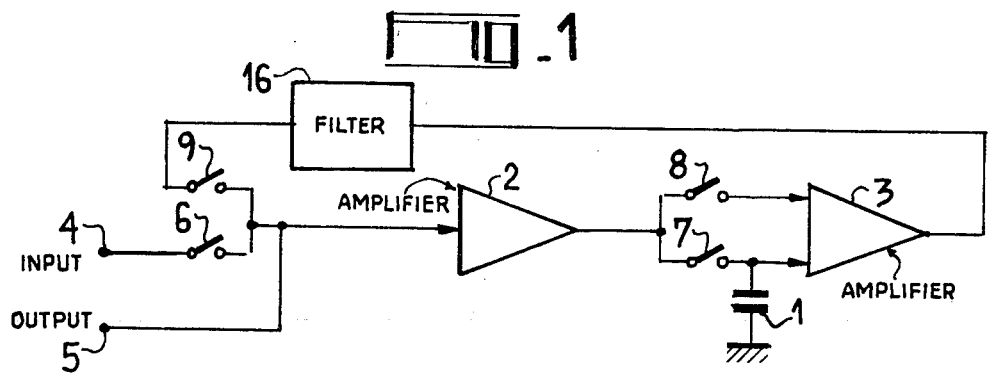
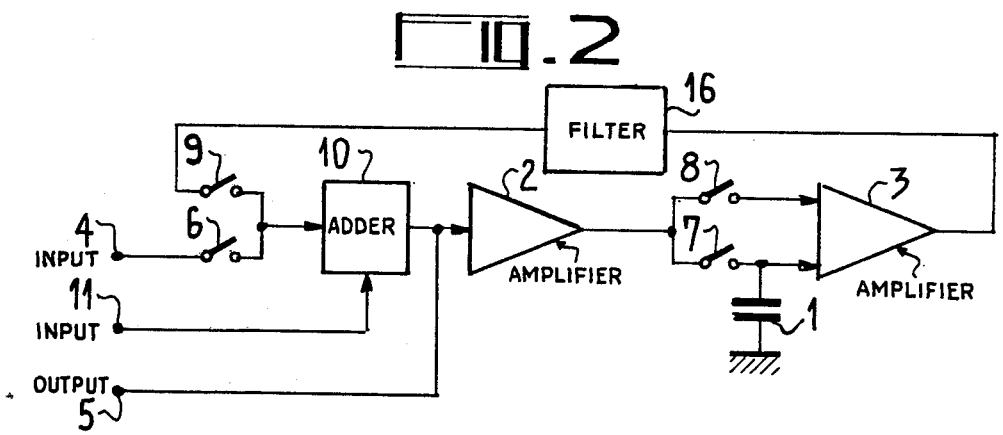
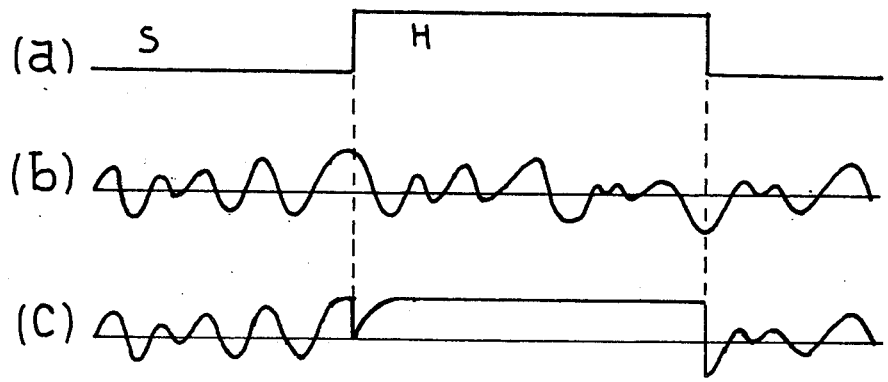

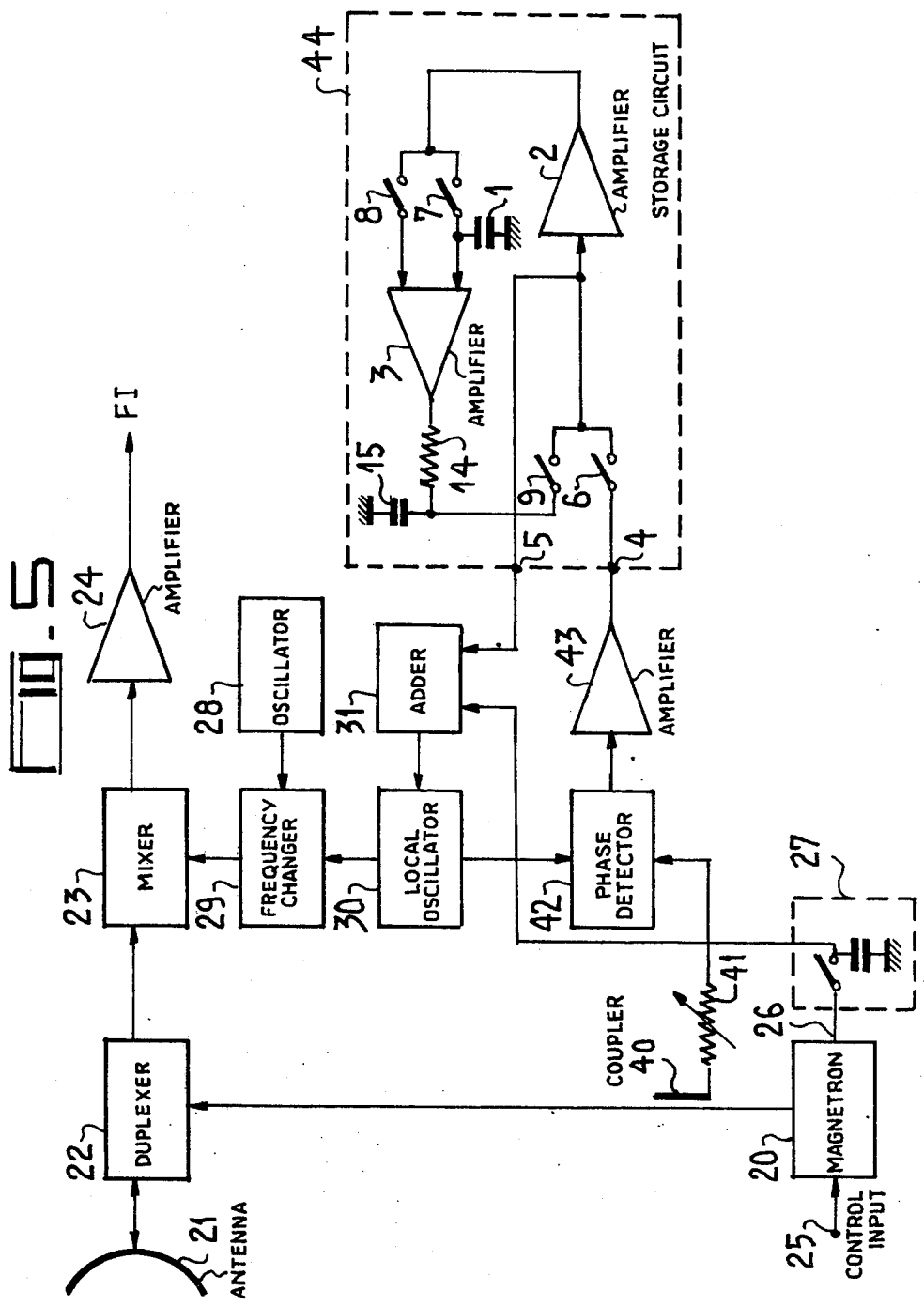

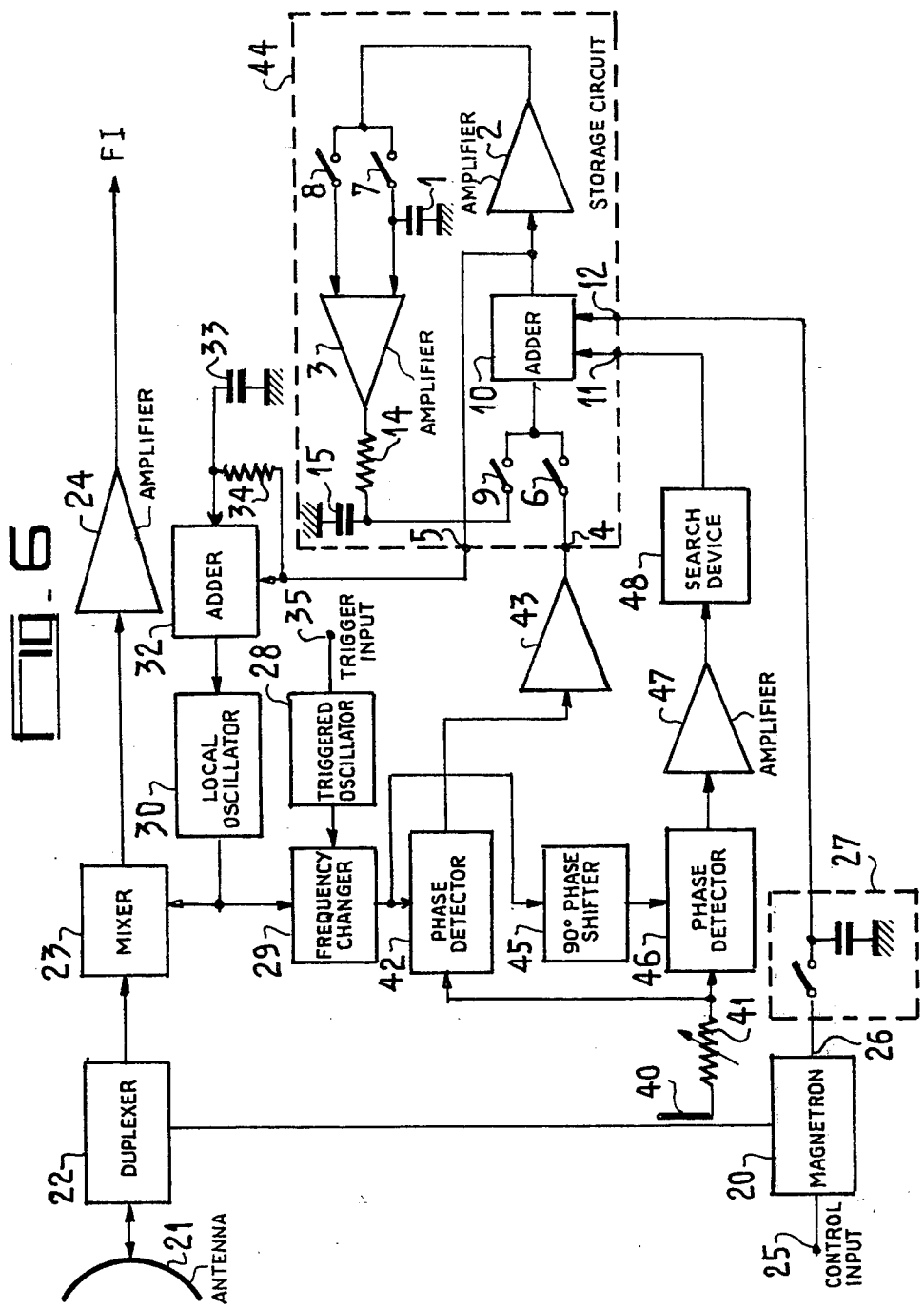

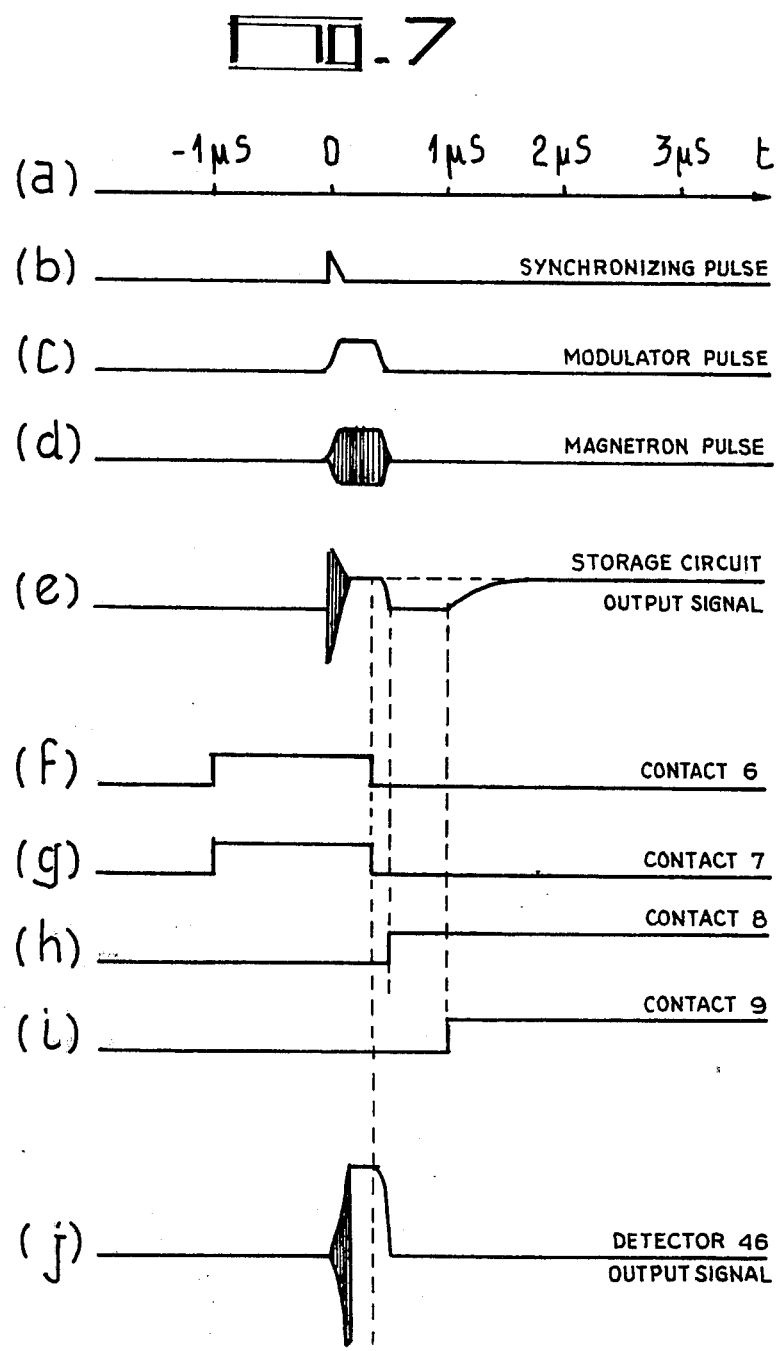

SAMPLE-AND-HOLD CIRCUIT FOR ANALOG VOLTAGES

FIELD OF THE INVENTION

The present invention relates to a storage circuit for analog voltages, also referred to as "sample and hold" circuits and to the utilization of such storage circuits in control systems such as those used in variable-frequency radars.

BACKGROUND OF THE INVENTION

Analog circuits can store only unipolar voltages. A certain loss of information over a period of time is unavoidable.

The organization of an analog store is centered around a very-low-leakage capacitor having a very high leakage resistance coupled with a rather low capacitance. In order that the voltage which is to be stored can be picked up from a circuit without disturbing the operation of the latter, while at the same time ensuring rapid charging of the capacitor and keeping leakage to a minimum, it is customary to connect the capacitor to the voltage source via an input amplifier with a low output impedance in order to effect rapid charging of the capacitor. It is also desirable to provide an output amplifier of high input impedance in order to minimize the loss of charging voltage and electronic circuit breakers serving, during a sampling phase, to apply an input signal to the capacitor by way of the input amplifier and then, as soon as the sampling phase has ended and during a holding phase, to insulate the capacitor from the input amplifier and stabilize the stored voltage through feedback from the output amplifier.

Conventional analog-voltage stores of this type generally use amplifier circuits which must have strictly constant gain levels. In order to maintain an output voltage equal to the input voltage, the parameters of the components must be adjusted so that the product of the amplification factors in the circuit remains equal to unity. This requires very delicate adjustments.

OBJECT OF THE INVENTION

The object of my invention is to provide a storage circuit for analog voltages which is not subject to these drawbacks and whose output voltage is not affected by variations in the gain of the amplifiers during the holding phase.

SUMMARY OF THE INVENTION

I realize this object, in accordance with my present invention, by the provision of two pairs of alternatively opened and closed switches, i.e. a first switch inserted between an input terminal connected to a source of voltage to be stored and an output terminal connected to a load, a second switch inserted between the output of a first amplifier and one of a pair of differential inputs of a second amplifier, this differential input being permanently connected to a storage capacitor which should have very little leakage, a third switch inserted between the output of the first amplifier and the other differential input of the second amplifier, and a fourth switch inserted in a feedback path extending from the output of the second amplifier to the input of the first amplifier and therefore also the output terminal. With the aid of control means whose operating cycle is divided into a sampling phase and a holding phase, the first and second switches are closed during the sampling phase (to the exclusion of the third and fourth switches) whereas the third and fourth switches are closed during the holding phase (to the exclusion of the first and second switches). In the sampling phase, therefore, the input terminal is connected directly (i.e. independently of the two amplifiers) to the output terminal and via the first amplifier to the storage capacitor which thereby builds up a charging voltage. In the holding phase the second amplifier feeds back an error voltage whose magnitude on the input of the first amplifier — and thus on the output terminal — substantially equals the magnitude which was attained by the source voltage at the end of the preceding sampling phase; the magnitude of this error voltage on the output of the first amplifier — and thus on the other differential input of the second amplifier — substantially balances the charge voltage of the capacitor.

According to a more particular aspect of this invention, my improved storage circuit as described above forms part of a pulse radar, which includes a voltage-responsive local oscillator of variable frequency and a generator of a pulsed carrier frequency, such as a magnetron. A frequency comparator such as a phase detector, connected to the local oscillator and to the carrier generator, delivers a control voltage which is applied to the input terminal of the storage circuit whose output terminal is connected to a control input of the local oscillator. The control voltage, which depends on the difference between the two frequencies received by the comparator, is thus directly applied to the local oscillator during a sampling phase, coinciding with the transmission of a radar pulse, and is maintained constant during the subsequent holding phase.

Other features and advantages of my invention will become apparent from the ensuing description given with reference to the accompanying drawing in which:

FIG. 1 is a diagram of a storage circuit in accordance with the invention;

FIG 2 is a diagram showing an alternate embodiment of my invention;

FIG. 3 is a set of graphs showing signals present at the input and output of the circuit;

FIG. 5 is a block diagram of a radar system comprising a storage circuit in accordance with the invention;

FIG. 6 is a block diagram similar to FIG. 5, showing a more elaborate radar system; and FIG. 7 is a set of graphs showing the signals present at various points in the system of FIG. 6.

SPECIFIC DESCRIPTION

Figure 4:
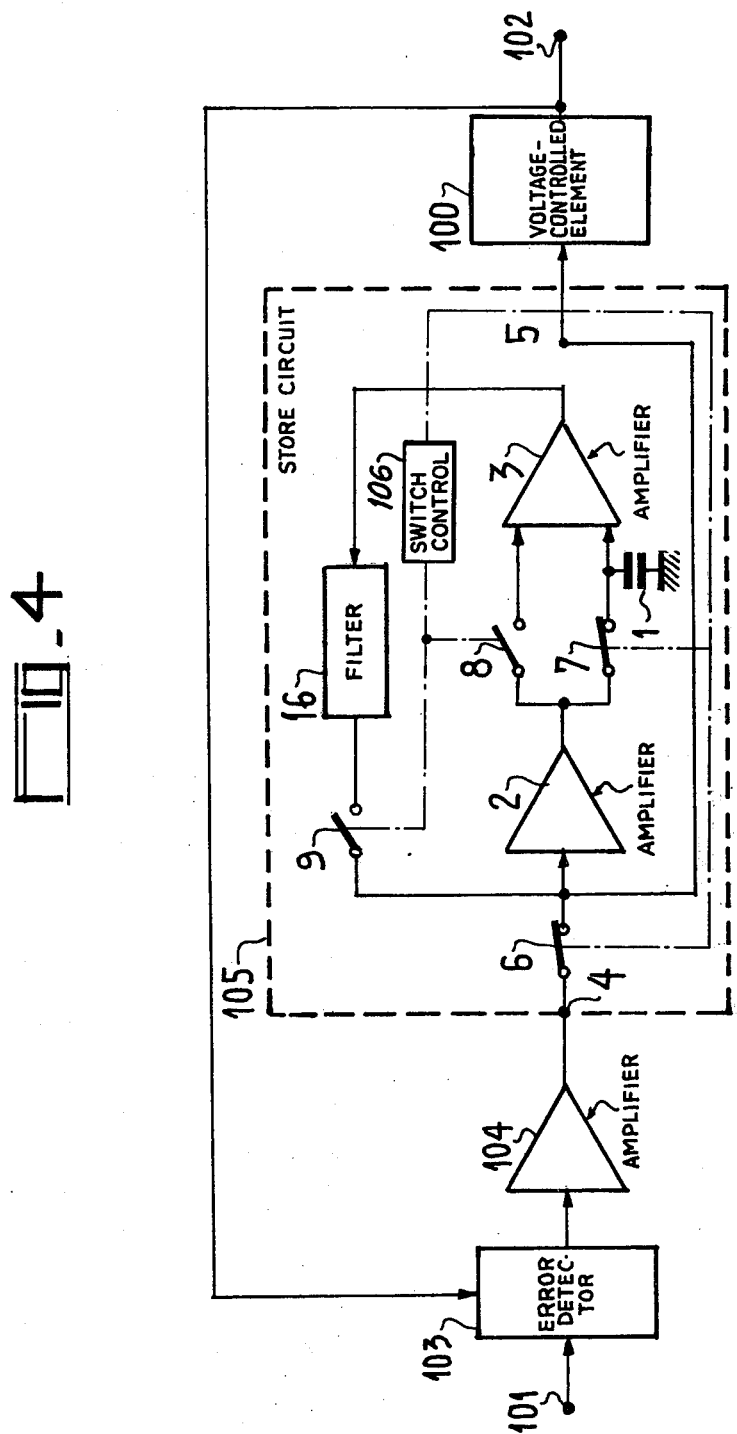
FIG. 4 is a block diagram of a control system comprising a storage circuit in accordance with the invention.

FIG. 1 diagrammatically illustrates a sample-and-hold circuit for the storage of analog voltages in accordance with the invention. This circuit comprises the following component elements:

- a very-low-leakage capacitor 1, for example a metallized polycarbonate capacitor having a leakage resistance in excess of 50,000 megohms for capacitance values of less than 0.2 $\mu F$;
- an input amplifier 2, generally an operational amplifier with a negative-feedback loop giving it a low output impedance, thereby enabling rapid charging of the capacitor 1 when a circuitbreaker 7 is closed, ans a high non-reactive input impedance in order not to disturb the circuits from which information is being taken;

an output amplifier 3 which is an operational amplifier with two differential inputs, and with a voltage-feedback loop in order to give it a high input impedance, one of its inputs being connected to the capacitor 1 from which it draws a low input current (for high performance I prefer to use operational amplifiers with input stages in the form of field-effect transistors);

a low-pass filter 16 to stabilize the circuit;

circuit breakers 6, 8 and 9 which, together with the aforementioned circuit breaker 7, establish various links between an input terminal 4, an output terminal 5 and components 1–3. These circuit breakers are generally constituted by electronic switches in the form of field-effect transistors which have a low leakage resistance when in their blocking condition. During a sampling phase, switches 6 and 7 are closed while switches 8 and 9 are open. The switch 6 applies the input voltage from the terminal 4 to the input of the amplifier 2 and to the output terminal 5 in parallel therewith. The output of the amplifier 2 is connected to the capacitor 1 via switch 7. During this sampling phase, the capacitor 1 charges to a value proportional to the input voltage, the gain of the amplifier 2 being not necessarily equal to unity.

At the end of the sampling phase, switches 6 and 7 open while switches 8 and 9 close, this position corresponding to the holding phase. Swtich 8 connects the output of the first amplifier 2 to the other input of the second amplifier 3, that is to say the one not connected to the capacitor 1, while switch 9 connects the output of the amplifier 3 to the input of the amplifier 2 and, consequently, to the output terminal 5 by way of the filter 16. During the holding phase, the output voltage from the amplifier 2 is compared with the voltage stored in the capacitor 1. The error voltage amplified in component 3 is recirculated to at the input of the amplifier 2. The output voltage furnished at the terminal 5 is therefore equal to the input voltage at the end of the sampling period and remains so until the next sampling period commences. Under these conditions, the amplifier 2 furnishes at its output a voltage equal to the voltage stored in the capacitor. Switch 7 therefore carries virtually zero voltage across its terminals and cannot cause any significant charge losses from the capacitor. Such losses as may occur are due to the input of the amplifier 3, to the capacitor itself and to the substrate to which it is soldered and which should be of low conductivity.

FIG. 2 illustrates another embodiment of my improved storage circuit. The circuit components of FIG. 1 are retained with the same references, as also in FIGS. 4–6 discussed hereinafter. An adder 10 is inserted between the two circuit breakers 6 and 9, on the one hand, and the input of amplifier 2, on the other hand. The adder has two inputs, one supplied either with the input voltage from the terminal 4 or with the output voltage from the amplifier 3, the other supplied with a second input voltage applied to a terminal 11. The output terminal 5, permanently connected to the input of the amplifier 2, is here also tied to the output of the adder 10.

The operation of this circuit takes place in two phases as in the preceding embodiment. During the sampling phase, the voltage stored in the capacitor 1 is proportional to the sum of the voltages applied to the input terminals 4 and 11. During the holding phase, the sum of the output voltage, added to the input voltage on terminal 11, is amplified in the amplifier 2 and compared with the stored voltage so that the output voltage from the amplifier 3 remains equal to the input voltage at terminal 4.

If, during the holding phase, the input voltage at terminal 11 tends to vary, this variation is also compensated by an equal variation, of opposite sign, in the output voltage from the amplifier 3. Thus, the voltage furnished at terminal 5 is constant despite variations in input voltage.

FIG. 3, by way of example, illustrates the form of the signals at various points in the circuit, as a function of time. Graph (a) represents the switchover, in a and cycle of operation of the circuit, between a sampling phase s and a holding phase H. Graph (a) shows, for example, a switch-control signal, whose lower level indicates that the switches 6 and 7 are closed and the switches 8 and 9 open, the higher level indicating the reverse situation. Graph (b) shows a variable signal applied to the input terminal 4 of FIG. 1 whereas graph (c) represents the output signal appearing at terminal 5. During the sampling phase s, the output signal is identical with the input signal. During the holding phase H, the output signal is constant and reproduces the input signal with the amplitude it had at the end of the immediately preceding sampling period, with very high fidelity. The discontinuity in the signal of graph (c) at the commencement of the holding period is due to the delaying effect of the low-pass filter 16.

The sample-and-hold circuit in accordance with the invention exhibits the conventional characteristics of its constituent operational amplifiers in regard to input impedance, input current, phase-shift voltage (and its temperature coefficient), pass-band, and so on. The drawbacks such as the non-linearity and the gain errors of these amplifiers, do not affect the operation of the system, thanks to the voltage-comparison loop which maintains the balance between the stored voltage on the capacitor and the output voltage from the amplifier 2, regardless of possible disturbances, non-linearity or errors.

The storage circuits in accordance with the invention have the further advantage of extremely fast operation. They can be arranged in any control system requiring a parameter to be held for a given duration. Such inclusion can be effected without modifying the pass-band of the control system.

I shall now describe, by way of example, the utilization of storage circuits according to my invention, in a radar system.

A voltage-controlled element is subjected to a discrete control signal. During interruptions in the control signal, the information furnished by the controlled element must retain the value which it had just prior to the interruption.

The controlled element may be an ocillator whose frequency is determined by a voltage, a variable-gain amplifier, or the like.

FIG. 4 represents a diagram of this kind of control system.

A voltage-controlled element 100 furnishes to an output terminal 102 a signal which is to be representative of an input signal applied to a terminal 101. If the input signal were continuous, the control would be of conventional kind. The circuit comprises an error detector 103 which compares the input signal with the output signal and furnishes an error voltage which is fed via by amplifier 104 to the control input of the element 100. During the interruptions of this discontinuous signal, the control voltage for the element 100 is maintained constant by a storage circuit 105 conforming to with that shown in FIG. 1. Its input 4 is therefore connected to the output of the amplifier 104 and its output 5 is tied to the control input of the element 100. Its operation has been described in the foregoing; the change in state of the circuit breakers 6, 7, 8 and 9 is brought about synchronously with the interruption of the input signal, by a conventional control device schematically shown at 106. This kind of control has the advantage of being very fast when the input signal is present, since the storage circuit 105 behaves like a simple connection between the terminals 4 and 5, introducing no modification in the transfer function through the control loop. It furthermore has the advantage of operating with extremely high fidelity during the interruption of the input signal, thanks to the storage circuit in accordance with the invention.

In the systems particularly illustrated in FIGS. 5 and 6, the controlled element is an oscillator whose frequency is determined by an applied voltage and which is used to modulate the incoming frequency in a variable-frequency active radar. In radars of this kind, the transmitter (often comprising a magnetron) generates short pulses (lasting from around 200 nanoseconds to a few microseconds) whose frequency varies in accordance with an approximately known law. The local oscillator is controlled to follow the outgoing frequency, as the latter shifts, with sufficient accuracy to maintain the intermediate frequency in the reception channel constant.

Certain known systems utilize a voltage furnished by the magnetron, approximately representing its frequency, in order to control the frequency of the oscillator just prior to transmission. During transmission, the frequency of the local oscillator is compared with the frequency of the wave emitted by the magnetron, generally with the aid of a frequency discriminator or a phase detector. The voltage proportional to the error is then stored during the whole recurrence period and applied to the local oscillator in order to reduce the error in the intermediate frequency derived from the received echoes.

In other systems, the frequency of the outgoing wave is measured during the pulse and a voltage representing this frequency is stored. After the pulse, the frequency of the local oscillator is measured in turn, the resulting voltage being compared with the stored voltage, and an automatic frequency-control device varies the frequency of the local oscillator in order to reduce the error to a minimum.

In these systems, a voltage must be held in the store throughout the time of each recurrence. The analogue-storage circuit in accordance with the invention lends itself particularly well to the performance of this function in these systems.

FIG. 5 illustrates a radar system comprising a storage circuit, here designated 44, according to my invention. The speed and fidelity of this circuit are fully exploited and make it possible to create a fast-acting automatic controller for correcting the frequncy of the local oscillator in a very short time on the order of a few hundred nanoseconds only.

Of the radar system, only a magnetron 20, an antenna 21, a duplexer 22, a reception channel including a mixer 23 and an intermediate-frequency amplifier 24, a local oscillator 30 and associated automatic-frequency-control means have been shown, in order to enable the invention to be understood. The other elements of the system with its transmitter, receiver and general synchronizing circuits are well known to persons skilled in the art and have been omitted for the sake of simplicity.

In this system, control of the frequency of the local oscillator is effected during the time of each transmitted pulse and the oscillator-control voltage is then stored for the period of recurrence, i.e. until the next pulse arrives.

The magnetron 20 has a control input 25 energized by pulses from a modulator (not shown). Magnetron 20 supplies at an output 26 a voltage furnished by a potentiometer or a resolver, for example, coupled to a nonillustrated motor controlling the carrier frequency generated by the magnetron. This voltage is substantially proportional to the operating frequency of the magnetron. Just prior to the transmission of a pulse, a capacitive storage circuit 27 picks up this voltage and preserves it. The voltage is then applied to the control input of the local oscillator 30 by way of an adder 31, in order to set the frequency to a value approximately equal to that of the magnetron. However, a residual error still exists, which is reduced by the fast-acting automatic frequency controller referred to above.

The pulses fed by the magnetron 20 are transmitted to the duplexer 22 and then to the antenna 21. On reception, the echoes intercepted by the antenna are directed by the duplexer to mixer 23 and then to preamplifier 24 which supplies the resulting signal of constant intermediate frequency FI to the other circuit elements (not shown) of the reception channel. The signals applied to the mixer 23 are mixed with a signal coming from the local oscillator 30 whose frequency is shifted in relation to the intermediate frequency FI by a fixed-frequency oscillator 28 and a frequency changer 29.

The automatic frequency controller comprises a coupler 40 which picks up a sample from the transmited pulse leaving the magnetron 20. This sample, oscillating at the carrier frequency as shown in graph (d) of FIG. 7 discussed hereinafter, has its amplitude calibrated by an attenuator 41 and is then injected into a phase comparator or detector 42. The detector is also supplied, at another input, with the signal furnished by the local oscillator 30, suitably adjusted by the regulating voltage coming from the storage circuit 27. The detector 42 is constituted by a simple mixer. The signal furnished by the detector is amplified by a wide-band video amplifier 43 and then applied to the frequency-control input of the local oscillator by way of my improved storage circuit 44 and the adder 31.

During the transmission of a pulse, the storage circuit 44 is in the sampling phase, only the switches 6 and 7 being closed. The input 4 is connected to the output 5 as along as the capacitor 1 is charging. The loop formed by the oscillator 30, the detector 42, the amplifier 43 and the adder 31 is closed. During this phase, the frequency of the local oscillator adjusts itself to the transmission frequency. The voltage stored in the capacitor 1 follows the control voltage at the terminal 4, although it need not necessarily be identical therewith. After the pulse and during the remainder of the recurrence period, the switches 8 and 9 are closed and the storage circuit 44 supplies to the terminal 5 the control voltage initially registered during the final phase of the preceding transmission, that is to say after the frequency of the local oscillator has been adjusted to that of the magnetron. In this application, the holding loop of the circuit comprises an integrator which takes the place of the low-pass filter 16 of FIGS. 1, 2 and 4, consisting of a resistor 14 and a capacitor 15 which are required to stabilize the loop by smoothing the error voltage fed back.

The storage circuit in accordance with the invention therefore accurately reproduces, during each recurrence period, the final error voltage of the automatic frequency controller and makes it possible to operate the local oscillator with a stable wave equal to the frequency of the magnetron.

The frequency changer 29 associated with the oscillator 28 shifts the frequency applied to the mixer 23 in order to ensure correct frequency change on reception. In certain radars, the automatic frequency controller of FIG. 5 has a number of drawbacks due to the imperfections of the IF changer 29 and cannot be used in this form, being then advantageously replaced by the modification shown in FIG. 6 whose automatic frequency controller is of more elaborate design. Elements idential with those of FIG. 5 have been indicated by the same references.

The local wave from the receiver, furnished by the local oscillator 30, is applied, here directly to the mixer 23 of the reception channel. The frequency of the local oscillator, therefore, differs from the frequency of the magetron by the intermediate frequency. The changer 29 associated with the IF oscillator is inserted between the local oscillator 30 and the phase detector 42 of the automatic-frequency-control loop. Because of this arrangement, the changer is used only during the time of transmission of pulses. The oscillator 28 is of the "triggered" type. It comprises a control input 35 which receives a triggering pulse synchronously with the pulse on terminal 25 triggering the magnetron 20.

The changer 29 could equally well be arranged between the attenuator 41 and the phase detector 46. It is the transmission frequency which is then shifted by the amount of the intermediate frequency.

The phase detector 42 is followed by the amplifier 43. The output of the latter is connected to the local oscillator during the time of transmission of pulses, through the storage circuit 44 which is here similar to that of FIG. 2, and an adder 32.

The adder 10 of storage circuit 44, upstream of the amplifier 2, has three inputs receiving not only the output voltage of amplifier 43, but also, on input 11, the carrier-dependent ancillary voltage furnished by the storage circuit 27 and, on input 12, a voltage furnished by a search device or sweep generator 48. The search device ensures that the phase loop of the automatic frequency controller locks on, during transmission, by causing the frequency of the local oscillator to scan. As soon as locking-on occurs, the search function ceases. The search device is controlled by a phase detector 46 supplied on the one hand with the outgoing radar pulse by the attenuator 41 and on the other hand with the local-oscillator wave through a 90° phase shifter 45 designed to achieve a maximum voltage at the output of the detector when the phase loop is locked on, i.e. when the frequency of local oscillator 30 matches the carrier frequency of that pulse. This voltage is used to inhibit operation of the search device by means of a threshold-type amplifier-separator 47. When the phase loop is not locked on, the sweep generator 48 operates freely. It furnishes a sawtooth voltage which, when transmitted to the local oscillator 30, modifies its frequency as a function of time. Upon the establishment of a frequency match, a blocking voltage appears at the output of the detector 46 and the amplifier 47 to halt the sweep of generator 48. The storage capacitor 1 register a voltage proportional to the sum of the voltages applied to the adder 10 and, during the holding phase, ensures that the frequency of the local oscillator remains constant.

Between the output of the storage circuit 44 and the local oscillator 30 an adder circuit 32 increases the loop voltage by a voltage equivalent to its means value, derived from an integnator constituted by a capacitor 33 and a resistor 34. This arrangement reduces, by the magnitude of the slow frequency drifts, the amplitude of the frequency errors which have to be compensated.

FIG. 7 illustrates the form of the signals occurring at various points in the system of FIG. 6. The graph (a) illustrates the time scale common to the other graphs which show the various sequences of operation of the system.

The time scale is graduated in microseconds, by way of example, the time 0 marking the instant of emission of the synchronizing pulse by the transmitter. This pulse is shown by graph (b). The modulator of the transmitter then supplies to the input 25 of the magnetron the pulse shown at (c). A pulse of the same shape (not shown), but substantially longer, is supplied to the trigger oscillator 28 at input 35. The pulse transmitted by the magnetron 20 is shown at (d). The graph (e) illustrates the voltage supplied at 5 by the storage circuit and the graphs (f), (g), (h) and (i) illustrate the positions of the contacts symbolizing the electric switches 6, 7, 8 and 9, respectively, the high level corresponding to the closed state and the low level to the open state of these switches.

Switches 6 and 7 are closed around 1 microsecond before the instant 0. The storage circuit is therefore in the sampling phase. It does not take part in the operation of the automatic-frequency-control loop.

As soon as the transmitted pulse has started, the search device 48 causes the local oscillator 30 to scan. The voltage furnished by the phase detector 42 oscillates at the best frequency between the carrier frequency of the transmitted pulse and the frequency of the locally generated wave. This beat oscillation decays to zero whereupon the loop voltage remains constant from the moment when lock-on takes place (graph e) until the end of the transmitted pulse. The graph (J) illustrates the so-called "presence" signal furnished by the detector 46 of the search circuit, this signal becoming constant as soon as lock-on is achieved to inhibit any further search. The switches 6 and 7 are opened around 50 nanoseconds before the end of the pulse. At the end of the pulse, the switch 8 closes, followed some few hundreds of nanoseconds later by the switch 9, whereupon the voltage loop of the storage circuit picks up the stored value, gradually at first on account of the presence of the integrator 14, 15. The control voltage for the local oscillator then remains constant virtually throughout the recurrence period. The cycle then commences afresh with the next recurrence.

The combination of a storage circuit in accordance with the invention with an automatic frequency controller, having a single phase loop, makes possible the use of an extremely simple circuit arrangement for resolving the inherent problems encountered in variable-frequency radar systems. In order to operate correctly, these phase loops must have a wide pass band. The storage circuit in accordance with the invention is sufficiently fast to cope with this particular application, without affecting the phase loop. Obviously, the present storage circuit is equally applicable to other radar systems and also to instrumention systems in general.

What is claimed is:

1. A sample-and-hold circuit comprising:
a first amplifier having an input and an output;
a second amplifier having a pair of differential inputs and an output;
an input terminal connected to a source of voltage to be stored;
an output terminal permanently connected to the input of said first amplifier;
a first switch inserted between said input terminal and said output terminal;
a storage capacitor permanently connected to one of said differential inputs;
a second switch inserted between the output of said first amplifier and said one of said differential inputs;
a third switch inserted between the output of said first amplifier and the other of said differential inputs;
a feedback path extending from the output of said second amplifier to the input of said first amplifier and to said output terminal;
a fourth switch in said feedback path; and
control means connected to said first, second, third and fourth switches for closing said first and second switches to the exclusion of said third and fourth switching during a sampling phase of an operating cycle, thereby connecting said input terminal independently of said amplifiers to said output terminal and via said first amplifier to said storage capacitor for building up a charge voltage thereon, and for closing said third and fourth switches to the exclusion of said first and second switches during a holding phase of said operating cycle, thereby feeding back an error voltage whose magnitude on the input of said first amplifier and thus on said output terminal substantially equals the magnitude of the source voltage at the end of the preceding sampling phase and whose magnitude on the output of said first amplifier and thus on said other of said differential inputs substantially balances said charge voltage.

2. A circuit as defined in claim 1, further comprising integrating means in said feedback path for smoothing said error voltage.

3. A circuit as defined in claim 1, further comprising an adder inserted between said first and fourth switches on the one hand and said output terminal and the input of said first amplifier on the other hand, said adder being connected to a supply of supplemental input voltage to be superimposed upon said source voltage.

4. In a pulse radar including a voltage-responsive local oscillator of variable frequency provided with a control input, a generator of a pulsed carrier frequency and comparison means coupled to said local oscillator and to said generator for producing a control voltage for said local oscillator depending upon the difference between said variable frequency and said carrier frequency,
the combination thereof with:
a first amplifier having an input and an output;
a second amplifier having a pair of differential inputs and an output;
an input terminal connected to said comparison means for receiving said control voltage;
an output terminal permanently connected to the input of said first amplifier and further connected to said control input;
a first switch inserted between said input terminal and said output terminal;
a storage capacitor permanently connected to one of said differential inputs;
a second switch inserted between the output of said first amplifier and said one of said differential inputs;
a third switch inserted between the output of said first amplifier and the other of said differential inputs;
a feedback path extending from the output of said second amplifier to the input of said first amplifier and to said output terminal;
a fourth switch in said feedback path; and
control means connected to said first, second, third and fourth switches for closing said first and second switches to the exclusion of said third and fourth switches during a sampling phase of an operating cycle, thereby connecting said input terminal independently of said amplifiers to said output terminal and via said first amplifier to said storage capacitor for building up a charge voltage thereon, and for closing said third and fourth switches to the exclusion of said first and second switches during a holding phase of said operating cycle, thereby feeding back an error voltage whose magnitude on the input of said first amplifier and thus on said output terminal substantially equals the magnitude of said control voltage at the end of the preceding sampling phase and whose magnitude on the output of said amplifier and thus on said other of said differential inputs substantially balances said control voltage.

5. The combination defined in claim 4, further comprising integrating means in said feedback path for smoothing said error voltage.

6. The combination defined in claim 4, further comprising circuit means connected to said generator for producing an ancillary voltage varying with said carrier frequency, and an adder inserted between said first and fourth switches on the one hand and said output terminal and the input of said first amplifier on the other hand, said adder being connected to said circuit means for superimposing said ancillary voltage upon said control voltage.

* * * * *